Figure 1:
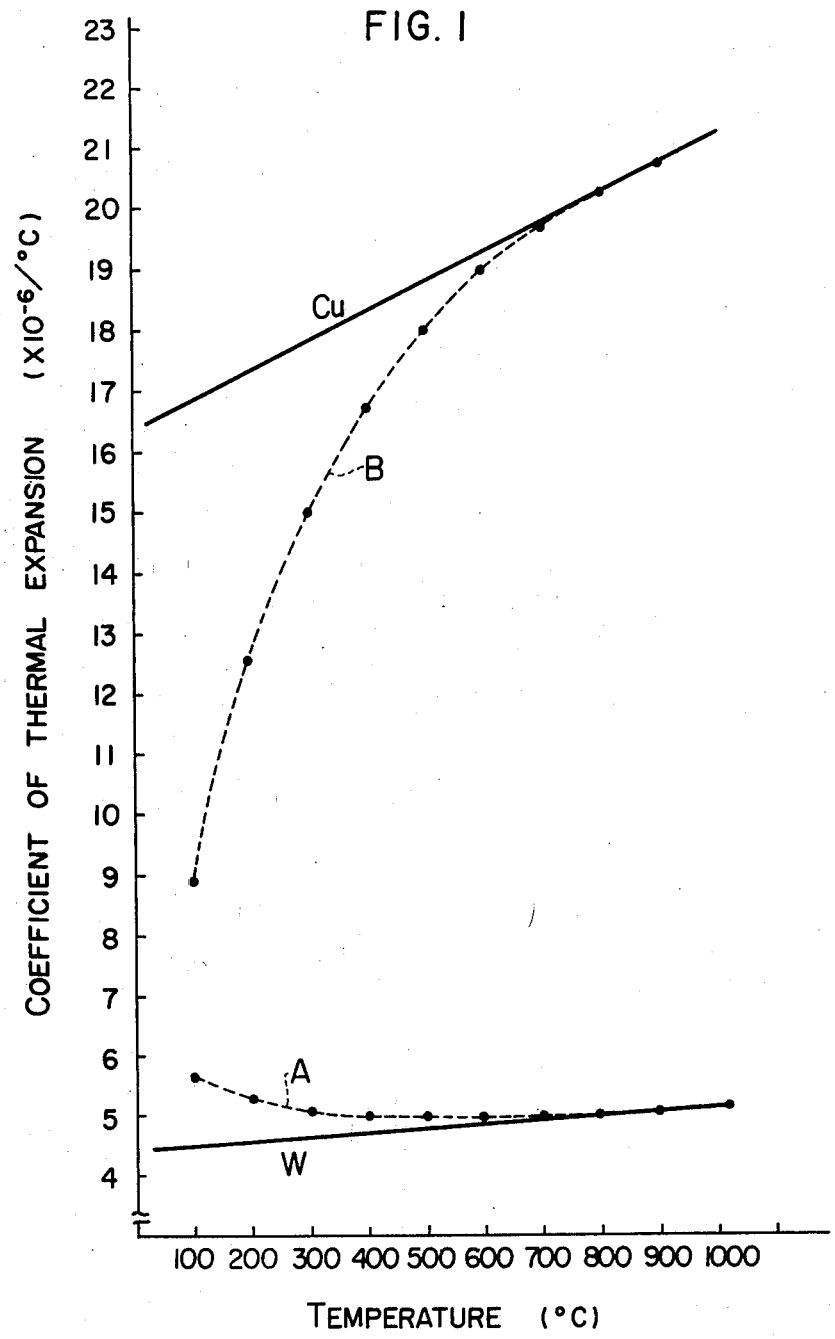

United States Patent [19]

Kuniya et al.

[11] 3,969,754

[45] July 13, 1976

[54] SEMICONDUCTOR DEVICE HAVING SUPPORTING ELECTRODE COMPOSITE STRUCTURE OF METAL CONTAINING FIBERS

[75] Inventors: Keiichi Kuniya, Hitachi; Tomio Iizuka, Ibaraki; Masateru Suwa, Hitachi; Tomio Yasuda, Hitachi; Takeshi Sasaki, Hitachi; Sakae Kikuchi, Takasaki; Hideo Suzuki, Katsuta, all of Japan

[73] Assignee: Hitachi, Ltd., Japan

[22] Filed: Oct. 21, 1974

[21] Appl. No.: 516,509

[30] Foreign Application Priority Data

Oct. 22, 1973  Japan............................ 48-119307

[52] U.S. Cl................................... 357/65; 357/66; 357/67; 357/81
[51] Int. Cl.² .................. H01L 23/48; H01L 29/40; H01L 29/46; H01L 29/62
[58] Field of Search .................... 357/65, 66, 67, 81

[56] References Cited

UNITED STATES PATENTS

| | | | |
|---|---|---|---|
| 3,097,329 | 7/1963 | Siemens | 357/65 |
| 3,128,419 | 4/1964 | Waidkotter | 357/65 |
| 3,273,029 | 9/1966 | Ross | 357/65 |
| 3,295,089 | 12/1966 | Moore | 357/65 |
| 3,399,331 | 8/1968 | Mutter et al. | 357/65 |

*Primary Examiner*—Andrew J. James
*Attorney, Agent, or Firm*—Craig & Antonelli

[57] ABSTRACT

A semiconductor device comprising a semiconductor substrate and a supporting electrode disposed at least on one surface of the semiconductor substrate, in which the supporting electrode has such a composite structure that fibers having a coefficient of thermal expansion substantially equal to or lower than that of the semiconductor substrate are embedded in a matrix of a metal having electric and heat conductivities higher than those of the fibers. This supporting electrode has a satisfactorily high heat conductivity and the coefficient of thermal expansion thereof is freely adjustable.

19 Claims, 2 Drawing Figures

SEMICONDUCTOR DEVICE HAVING SUPPORTING ELECTRODE COMPOSITE STRUCTURE OF METAL CONTAINING FIBERS

This invention relates to a semiconductor device which comprises a semiconductor substrate and a supporting electrode disposed at least on one surface of the semiconductor substrate.

An important problem for a semiconductor device composed of a substrate of semiconductor material such as silicon, germanium or an intermetallic compound is how to effectively dissipate the heat generated in the semiconductor substrate during operation of the device. Unless this heat is effectively dissipated, the semiconductor substrate will be heated up to a considerably high temperature above the allowable limit and the desired performance of the semiconductor device will not be exhibited due an increase in the leakage current, a reduction in the switching voltage, etc.

The above problem can be solved by mounting the semiconductor substrate on a body which has a large surface area and is made of a metal such as copper which is a good conductor of electricity and heat. However, there is a great difference between the coefficient of thermal expansion of the semiconductor substrate and that of copper. Thus, when they are joined together, a stress tends to be imparted to the junction surface due to the great difference in the coefficient of thermal expansion, and the semiconductor substrate which is mechanically weak would be destroyed due to such a stress. It is therefore a common practice to prepare a supporting electrode in the form of a plate of a material having a coefficient of thermal expansion substantially equal to that of the semiconductor substrate and to provide such supporting electrode on one surface or opposite surfaces of the semiconductor substrate. Molybdenum or tungsten is commonly used to form the supporting electrode. Molybdenum and tungsten have a coefficient of thermal expansion substantially equal to that of silicon and germanium, and they have also relatively high electric and heat conductivities. Employment of molybdenum or tungsten for forming the supporting electrode is advantageous in that the heat generated in the semiconductor substrate can be effectively dissipated to obviate destruction of the semiconductor substrate. The "coefficient of thermal expansion", at a certain temperature, mentioned hereinabove and in the whole of the specification is given by dividing a linear expansion caused in case of temperature rise from the room temperature to that temperature by the difference between the temperatures. Thus, molybdenum and tungsten have the properties suitable for the supporting electrode. However, the demand for the improvement in the properties of the supporting electrode is ever increasing. The progress of the technology in the field of this kind is remarkable, and new intermetallic compounds have been discovered for use as semiconductors. Further, a rapid progress has also been attained in the manufacturing processes. There is therefore an ever-increasing and stronger demand for the increase in the capacity and the reduction in the size of semiconductor devices.

In connection with the desired increase in the capacity of semiconductor devices, it becomes necessary to more effectively dissipate the heat generated in the semiconductor substrate. Although this requirement may be achieved by enlarging the surface area of the supporting electrode, this is inconsistent with the demand for the reduction in the size of semiconductor devices. Accordingly, it becomes necessary to increase the heat conductivity of the supporting electrode.

It is a primary object of the present invention to provide a semiconductor device provided with a supporting electrode which can effectively dissipate the heat generated in the semiconductor substrate thereby obviating any damage thereto.

Another object of the present invention is to provide a semiconductor device provided with a supporting electrode having a coefficient of thermal expansion which is freely adjustable.

According to the present invention, the supporting electrode has such a composite structure that fibers having a coefficient of thermal expansion substantially equal to or lower than that of the semiconductor substrate are embedded in a matrix of a metal having electric and heat conductivities higher than those of the fibers.

As described already, the supporting electrode is required to have high heat and electric conductivities in order that the heat generated in the semiconductor substrate can be effectively dissipated. This supporting electrode is also required to have a coefficient of thermal expansion substantially equal to that of the semiconductor substrate.

The present invention is based on the finding that the composite structure above described can be prepared to possess a coefficient of thermal expansion substantially equal to that of the semiconductor substrate as well as very satisfactory heat and electric conductivities. The coefficient of thermal expansion, heat conductivity and electric conductivity of the composite structure can be controlled by adjusting the content of the fibers. While the coefficient of thermal expansion of the composite structure can be reduced with the increase in the content of the fibers, the heat and electric conductivities thereof are lowered correspondingly.

A series of continuous studies have proved that the coefficient of thermal expansion of the composite structure varies remarkably depending on the arrayed direction of the fibers. More precisely, it has been found that the coefficient of thermal expansion of the composite structure along the arrayed direction of the fibers has a value quite closer to that of the fibers than the value generally expected from the content of the fibers. It has also been found that the composite structure has heat and electric conductivities which coincide substantially with the values generally expected from the content of the fibers. Further, it has been found that the heat and electric conductivities do not substantially vary depending on the arrayed direction of the fibers.

The coefficient of thermal expansion of the composite structure is never smaller than that of the fibers. It is therefore necessary to select such fibers which have a coefficient of thermal expansion substantially equal to or lower than than that of the semiconductor substrate in order that the coefficient of thermal expansion of the composite structure is as close to that of the semiconductor substrate as possible. It is of course that one or more kinds of fibers having a coefficient of thermal expansion higher than that of the semiconductor substrate may be mixed in the fibers used provided that the whole of the fibers can have a coefficient of thermal expansion substantially equal to or lower than that of the semiconductor substrate. On the other hand, the heat and electric conductivities of the composite structure should be as high as possible. It is therefore desirable that the matrix be formed of a material having highest possible heat and electric conductivities. In order that the composite structure can possess better heat and electric conductivities than those of a conventional supporting electrode consisting solely of molybdenum or tungsten, the matrix must be formed of a material having better heat and electric conductivities than those of the fibers.

It is desirable that the content of the fibers in the composite structure incorporated in a semiconductor device as the supporting electrode for the semiconductor substrate varies gradually in the thickness-wise direction in such a manner that the content is larger in the electrode portion engaging the semiconductor substrate and smaller in the opposite electrode portion. The supporting electrode of such a structure is advantageous in that the coefficient of thermal expansion thereof can be varied gradually in the thickness-wise direction such that it is smallest in the electrode portion engaging the semiconductor substrate.

The fibers are desirably arrayed in parallel with the surface of the semiconductor substrate. A major cause of destruction of the semiconductor substrate is due to the fact that the semiconductor substrate cannot expand to follow expansion of the supporting electrode in a direction parallel to the surface of the semiconductor substrate. In view of the above problem, it is very significant to array the fibers in parallel with the surface of the semiconductor substrate for minimizing expansion of the supporting electrode in the direction parallel to the substrate surface. It is more desirable that the fibers cross one another to form a plurality of networks spaced in the thickness-wise direction and such networks are disposed in parallel with the substrate surface.

A lead wire of copper or a base electrode of copper is generally soldered to the surface of the supporting electrode remote from the surface with which the supporting electrode engages the semiconductor substrate. In this case, corrosion occurs frequently at the junction when the junction is a combination of different metals. According to the present invention, such a problem of corrosion can be obviated due to the fact that the supporting electrode is in the form of the composite structure in which the material forming the matrix is copper. The obviation of the problem of corrosion can be ensured by covering the surface of the composite structure with a thin layer of copper. The provision of such copper thin layer can easily be made in a conventional manner.

In a simplest form of the supporting electrode in the present invention, fibers of a material having the same coefficient of thermal expansion as that of a semiconductor substrate are embedded in a matrix of copper. By employing such a material, the coefficient of thermal expansion of the composite structure can be made close to that of the semiconductor substrate, and the heat and electric conductivities thereof can be made remarkably better than those of the semiconductor substrate. The fibers may be distributed in such a manner that the content thereof is larger in the electrode portion engaging the semiconductor substrate than in the opposite electrode portion, so that the electrode portion engaging the semiconductor substrate may have a coefficient of thermal expansion substantially equal to that of the semiconductor substrate and the opposite electrode portion may have a coefficient of thermal expansion substantially equal to that of copper.

When the semiconductor substrate is of silicon or germanium, it is preferable to emply fibers such as molybdenum, tungsten, graphite or an alloy of iron, nickel and cobalt. Of course, any other suitable material can be employed since the requirement for the fibers is that the coefficient of thermal expansion thereof should be substantially equal to or lower than that of the semiconductor substrate.

It has been found that the coefficient of thermal expansion of the composite structure along the arrayed direction of the fibers is very close to that of the fibers when the content of the fibers is more than 20 % by volume. For example, in the case of the composite structure in which 20 % by volume of tungsten fibers were embedded in a matrix of copper in arrayed relation in one direction, the coefficient of thermal expansion thereof along the arrayed direction of the metal fibers was $6.0 \times 10^{-6}/°C$ at room temperature. This value is close to the coefficient of thermal expansion of tungsten in view of the fact that the coefficient of thermal expansion of copper is $16.5 \times 10^{-6}/°C$ and that of tungsten is $4.4 \times 10^{-6}/°C$. It is therefore desirable that the content of the fibers be more than 20 % by volume when the fibers are uniformly distributed throughout the composite structure.

It has been found that the coefficient of thermal expansion of the composite structure along the arrayed direction of the fibers approaches further toward that of the fibers with the increase in the content of the fibers, and it is almost equal to the coefficient of thermal expansion of the fibers when the content of the fibers is increased up to 50 % by volume. In view of the above fact, it is desirable that the content of the fibers be varied in the thickness-wise direction of the composite structure in such a manner that the content of the fibers in the electrode portion engaging the semiconductor substrate is selected to be 50 % by volume and the fiber content is gradually reduced toward the opposite electrode portion remote from the semiconductor substrate. The fiber content may be 0 % by volume in the latter portion to which the lead wire of copper or the base electrode of copper is connected.

Figure 2:
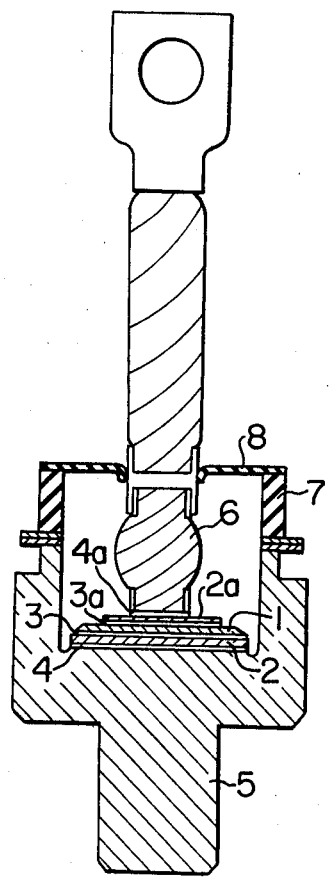

Some embodiments of the present invention will now be described with reference to the accompanying drawing, in which:

FIG. 1 is a graph showing the relation between the temperature and the coefficient of thermal expansion of a composite structure obtained by embedding tungsten fibers in a matrix copper; and FIG. 2 is a schematic sectional view of an embodiment of the semiconductor device according to the present invention.

EMBODIMENT 1

A composite structure was made in which 30 % by volume of tungsten fibers 0.1 mm in diameter were embedded in a matrix of copper in arrayed relation in one direction, and the coefficient of thermal expansion of this composite structure was measured within a temperature of 100°C to 900°C. The measurement was carried out in the arrayed direction A of the tungsten fibers and in a direction B perpendicular to the arrayed direction A. The measured values are plotted in FIG. 1 in which the vertical and horizontal axes represent the coefficient of thermal expansion and temperature respectively. Here, the "coefficient of thermal expansion" is, as previously mentioned, given by dividing a linear expansion caused in case of temperature rise from the room temperature to a temperature at which the coefficient of thermal expansion is to be described by the difference between the room temperature and that temprature. For example, the coefficient of thermal expansion at 700°C is given by:

$$\frac{\text{length at } 700°C - \text{length at room temperature}}{700 - \text{room temperature}}$$

FIG. 1 shows also the coefficient of thermal expansion of copper and tungsten. The coefficient of thermal expansion of the composite structure in the arrayed direction A of the tungsten fibers is slightly larger than that of tungsten when measured at a temperature of 100°C. However, in accordance with temperature rise, an effect due to the characteristic of the matrix of copper is lowered in linear expansion and only the characteristic of tungsten fibers appears largely. Thus, at a high temperature, the coefficient of thermal expansion of the composite structure becomes near to that of tungsten and, as shown in Figure, it becomes substantially equal to that of tungsten at 700°C. The coefficient of thermal expansion of the composite structure in the direction B perpendicular to the arrayed direction A of the tungsten fibers is about $8.9 \times 10^{-6}$/°C when measured at 100°C. This value is larger than the coefficient of thermal expansion of tungsten at 1100°C but remarkably smaller than that of copper at 100°C. However, the coefficient of thermal expansion of the composite structure in this direction B increase rapidly with the temperature rise and becomes substantially equal to that of copper when a temperature of 700°C is reached.

EMBODIMENT 2

A composite structure was made by embedding tungsten fibers in a matrix of copper in arrayed relation in one direction, and a semiconductor device provided with this composite structure as a supporting electrode was assembled. This semiconductor device has a construction as shown in FIG. 2.

Referring to FIG. 2, a semiconductor substrate 1 is provided on opposite surfaces thereof with a pair of supporting electrodes 2 and 2a each in the form of a composite structure consisting of a matrix of copper and tungsten fibers. The supporting electrodes 2 and 2a are soldered to the semiconductor substrate 1 by thin solder layers 3 and 3a respectively. Further, the supporting electrode 2 is fixed to a base electrode 5 by a solder layer 4, while the other supporting electrode 2a is connected to a lead wire 6 by a solder layer 4a. A cylindrical member 7 is connected at one end thereof to the base electrode 5 and at the other end thereof to a cover member 8. Nitrogen gas is filled within the sealed space defined by the base electrode 5, cylindrical member 7 and cover member 8 so as to prevent the semiconductor substrate 1 from being adversely affected by moisture.

The semiconductor substrate 1 was made of silicon. The supporting electrodes 2 and 2a were made in a manner as described below. At first, tungsten fibers 0.1 mm in diameter arrayed in one direction were placed in a quartz tube one end of which was tightly closed. This quartz tube was heated in a vacuum chamber maintained at a vacuum of 2 to $5 \times 10^{-6}$ mmHg to subject the tungsten fibers to degassing treatment. The open end of the quartz tube containing the tungsten fibers therein was immersed in a bath of oxygen-free copper which was heated to 1,200°C in the vacuum chamber and maintained in a molten state. Argon gas was then supplied into the vacuum chamber to raise the pressure within the vacuum chamber to one atmosphere. The melt of oxygen-free copper was forced into the quartz tube to fill the space containing the tungsten fibers therein. After allowing the vacuum chamber to cool down, the composite structure consisting of the matrix of copper and tungsten fibers was taken out of the quartz tube. The composite structure was then rolled in the arrayed direction of the tungsten fibers into a plate form, and this plate was cut into the shape of the supporting electrode.

A plurality of composite structures containing 20 %, 30 %, 40 % and 50 % by volume of tungsten fibers strength, electric conductivity, coefficient of thermal expansion and heat conductivity of these composite structures were measured along the arrayed direction of the tungsten fibers. The table below shows the results of measurement. In the table, the corresponding properties of molybdenum and tungsten are also shown for the sake of comparison with the measured values. Further, the heat conductivity in the table is represented by a multiple of that of pure molybdenum which is taken as unity.

Table

| Material | Various properties of composite structures | | | |
|---|---|---|---|---|
| | Tensile strength (kg/mm²) | Electric conductivity (%) | Coefficient of thermal expansion ($\times 10^{-6}$/°C) | Heat conductivity (Multiple of Mo) |
| Cu — 20 % W by volume | 60 | 80 | 6.0 | 2.8 |
| Cu — 30 % W by volume | 85 | 75 | 5.3 | 2.5 |
| Cu — 40 % W by volume | 110 | 68 | 5.0 | 2.2 |
| Cu — 50 % W by volume | 130 | 60 | 4.6 | 2.0 |
| Pure Mo | — | 28 | 5.5 | 1.0 |
| Pure W | — | 31 | 4.4 | 1.2 |

It will be seen from the table showing the results of measurement that the electric conductivity and heat conductivity could be remarkably improved compared with pure molybdenum and pure tungsten. Further, the coefficient of thermal expansion approached more to that of tungsten than the value computed simply on the basis of the proportion of the tungsten fibers, and therefore, a low coefficient of thermal expansion as well as high heat and electric conductivities could be obtained.

EMBODIMENT 3

A composite structure having 20 % by volume of tungsten fibers and 20 % by volume of carbon fibers embedded in a matrix of copper was made according to the same process as that described in Embodiment 2. This composite structure had a coefficient of thermal expansion of $3.5 \times 10^{-6}$/°C and an electric conductivity of 76 % along the arrayed direction of the fibers and was very satisfactory for use as a supporting electrode for a semiconductor substrate of silicon or germanium.

EMBODIMENT 4

A composite structure having tungsten fibers disposed in a network form in a matrix of copper was made. More precisely, this composite structure was made by alternately laminating a plurality of knit nets of tungsten fibers and a plurality of knit nets of copper fibers, inserting the laminate into a quartz tube and carrying out the same process as described hereinbefore. The nets of tungsten fibers were laminated in slightly staggered relation from one another so as to eliminate variations of the coefficient of thermal expansion depending on the direction. Subsequently, a plate 30 mm in diameter and 2 mm thick was cut from this composite structure in parallel with the disposed direction of the tungsten fibers. The tungsten fibers occupied 50 % of the total volume of the composite structure, and the coefficient of thermal expansion and electric conductivity in the longitudinal direction thereof were about $5.2 \times 10^{-6}/°C$ and about 63 % respectively. This composite structure was used as a supporting electrode and a semiconductor substrate of silicon was employed to assemble a semiconductor device having a construction as shown in FIG. 2. The thermal resistance of this device could be reduced by about 30 % compared with a device having a supporting electrode of pure molybdenum.

It will be understood from the foregoing detailed description that the semiconductor device according to the present invention is advantageous in that heat can be satisfactorily effectively transferred from the semiconductor substrate and the stress imparted to the semiconductor substrate can be controlled. Such advantage can be obtained because the composite structure constituting the supporting electrode possesses a coefficient of thermal expansion substantially equal to that of the semiconductor substrate and possesses also satisfactory heat and electric conductivities due to the fact that, on one hand, the coefficient of thermal expansion of the composite structure depends principally on the coefficient of thermal expansion of the fibers and, on the other hand, the heat and electric conductivities thereof do not depend on the properties of the fibers.

What is claimed is:

1. A semiconductor device comprising a semiconductor substrate and a supporting electrode disposed in area contact on at least one surface of said semiconductor substrate, wherein said supporting electrode comprises a composite structure including a matrix of a metal and a plurality of fibers embedded in said metal matrix, said metal matrix having electric and heat conductivities higher than those of said fibers, said fibers having a coefficient of thermal expansion at most substantially equal to that of said semiconductor substrate.

2. A semiconductor device comprising a semiconductor substrate having major surfaces and at least one supporting electrode disposed on at least one of said major surfaces of said semiconductor substrate for supporting the semiconductor substrate in face-to-face area contact through a bonding layer, wherein said supporting electrode comprises a composite structure including a matrix of a metal and a plurality of fibers embedded in said metal matrix, said metal matrix having electric and heat conductivities higher than those of said fibers, said fibers having a coefficient of thermal expansion at most substantially equal to that of said semiconductor substrate, and said fibers being arranged in said metal matrix in parallel with the surface of said semiconductor substrate.

3. A semiconductor device comprising a semiconductor substrate having major surfaces and at least one supporting electrode disposed on at least one of said major surfaces of said semiconductor substrate for supporting the semiconductor substrate in face-to-face area contact through a bonding layer, wherein said supporting electrode comprises a composite structure including a matrix of a metal and a plurality of fibers embedded in said metal matrix, said metal matrix having electric and heat conductivities higher than those of said fibers, said fibers having a coefficient of thermal expansion at most substantially equal to that of said semiconductor substrate, and said fibers being arrayed in said metal matrix in parallel with the surface of said semiconductor substrate in such a fashion that the content thereof in said metal matrix is gradually reduced from the matrix portion engaging said semiconductor substrate toward the matrix portion remote from said semiconductor substrate.

4. A semiconductor device comprising a semiconductor substrate having major surfaces and at least one supporting electrode disposed on at least one of said major surfaces of said semiconductor substrate for supporting the semiconductor substrate in face-to-face area contact through a bonding layer, wherein said supporting electrode comprises a composite structure including a matrix of a metal and a plurality of fibers embedded in said metal matrix, said metal matrix having electric and heat conductivities higher than those of said fibers, said fibers having a coefficient of thermal expansion at most substantially equal to that of said semiconductor substrate, and said plurality of fibers crossing one another to form a plurality of networks which are disposed in said metal matrix in parallel with the surface of said semiconductor substrate.

5. A semiconductor device as claimed in claim 2, wherein the content of said fibers is more than 20 % by volume.

6. A semiconductor device as claimed in claim 2, wherein the content of said fibers in the matrix portion engaging said semiconductor substrate is more than 50 % by volume.

7. A semiconductor device comprising a semiconductor substrate having major surfaces, said semiconductor substrate being one selected from the group of silicon and germanium and a supporting electrode disposed on at least one of said major surfaces of said semiconductor substrate for supporting the semiconductor substrate in face-to-face area contact through a bonding layer, wherein said supporting electrode comprises a composite structure including a matrix of copper and a plurality of tungsten fibers embedded in said copper matrix in parallel with said at least one major surface of the semiconductor substrate.

8. A semiconductor device as claimed in claim 3, wherein the content of said fibers is more than 20 % by volume.

9. A semiconductor device as claimed in claim 3, wherein the content of said fibers in the matrix portion engaging said semiconductor substrate is more than 50 % by volume.

10. A semiconductor device as claimed in claim 3, wherein said metal constituting the matrix is copper and said fibers is one selected from the group of molybdenum, tungsten, graphite and iron-nickel-cobalt alloy.

11. A semiconductor device as claimed in claim 4, wherein the content of said fibers is more than 20 % by volume.

12. A semiconductor device as claimed in claim 4, wherein the content of said fibers in the matrix portion engaging said semiconductor substrate is more than 50 % by volume.

13. A semiconductor device as claimed in claim 4, wherein said metal constituting the matrix is copper and said fibers is one selected from the group of molybdenum, tungsten, graphite and iron-nickel-cobalt alloy.

14. A semiconductor device as claimed in claim 2, wherein said metal constituting the matrix is copper and said fibers is one selected from the group of molybdenum, tungsten, graphite and iron-nickel-cobalt alloy.

15. A semiconductor device as claimed in claim 1, wherein said plurality of fibers are embedded in said metal matrix in a gradually varying volume content, said volume content decreasing from the portion of said composite structure contacting said semiconductor substrate to a portion of said composite structure remote from said semiconductor substrate.

16. A semiconductor device as claimed in claim 15, wherein said volume content of said fibers in said metal matrix exhibits a total volume content of more than 20 % by volume.

17. A semiconductor device as claimed in claim 16, wherein said portion of said composite structure contacting said semiconductor substrate has a volume content of said fibers in said metal matrix of at least 50 % by volume.

18. A semiconductor device as claimed in claim 15, wherein said volume content of said fibers in said metal matrix exhibits a total volume content from about 20 % to about 50 % by volume.

19. A semiconductor device as claimed in claim 1, wherein said metal constituting the matrix is copper and said fibers is one selected from the group of molybdenum, tungsten, graphite and iron-nickel-cobalt alloy.

* * * * *